United States Patent
Rozario et al.

(10) Patent No.: US 7,298,159 B1
(45) Date of Patent: Nov. 20, 2007

(54) METHOD OF MEASURING THE LEAKAGE CURRENT OF A DEEP TRENCH ISOLATION STRUCTURE

(75) Inventors: Lisa V. Rozario, San Jose, CA (US); Andy Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/176,994

(22) Filed: Jul. 7, 2005

(51) Int. Cl.
*G01R 31/26* (2006.01)
*G01R 31/00* (2006.01)

(52) U.S. Cl. ............... 324/765; 324/763; 324/769; 438/14

(58) Field of Classification Search ........ 324/754–769; 438/14–18
See application file for complete search history.

(56) References Cited

U.S. PATENT DOCUMENTS

| | | | | |
|---|---|---|---|---|
| 4,520,448 A | * | 5/1985 | Tremintin | 716/19 |
| 5,486,772 A | * | 1/1996 | Hshieh et al. | 324/769 |
| 6,184,048 B1 | * | 2/2001 | Ramon | 438/14 |
| 6,249,138 B1 | * | 6/2001 | Huang et al. | 324/765 |
| 6,377,067 B1 | * | 4/2002 | Yang et al. | 324/769 |
| 6,859,023 B2 | * | 2/2005 | Yamanaka et al. | 324/71.1 |

* cited by examiner

*Primary Examiner*—Ha Tran Nguyen
*Assistant Examiner*—Emily Y Chan
(74) *Attorney, Agent, or Firm*—Mark C. Pickering

(57) ABSTRACT

The trench leakage current of a deep trench isolation structure is measured. The deep trench isolation structure, which is filled with polysilicon, contacts both a first region of a first conductivity type and a second region of a second conductivity type, and is proximate to a third region of the first conductivity type formed in the second region. Test voltages are applied to the structures and the leakage current is measured

20 Claims, 2 Drawing Sheets

METHOD OF MEASURING THE LEAKAGE CURRENT OF A DEEP TRENCH ISOLATION STRUCTURE

BACKGROUND OF THE INVENTION

1. Field of the Invention

The present invention relates to deep trench isolation structures and, more particularly, to a method of measuring the leakage current of a deep trench isolation structure.

2. Description of the Related Art

A deep trench isolation structure is a well-known semiconductor structure that is used to isolate laterally adjacent regions of a substrate, epitaxial layer, or well from each other. The structure is commonly formed by first etching a deep trench in the substrate or through an epitaxial layer into the substrate. Once formed, the trench is typically lined with oxide, and then filled with polysilicon. (Other processing, such as channel stop implants, is often associated with the formation of a trench.)

FIG. 1 shows a cross-sectional diagram that illustrates an example of a prior-art semiconductor structure 100 that utilizes deep trench isolation. As shown in FIG. 1, semiconductor structure 100 includes a p– substrate 110, and an n+ buried layer 112 that is formed in p– substrate 110. In addition, structure 100 includes an n– well 114 that is formed in p– substrate 110 to extend down from the top surface of p– substrate 100 to n+ buried layer 112.

As further shown in FIG. 1, semiconductor structure 100 includes a lateral region 116, and a deep trench isolation structure 118 that is formed in p– substrate 110 to isolate n+ buried layer 112 and n– well 114 from lateral region 116. Deep trench isolation structure 118 includes a trench 120, a layer of oxide 122 that contacts p– substrate 110, n+ buried layer 112 and n– well 114, and a polysilicon region 124 that fills up trench 120.

In addition, semiconductor structure 100 includes a p-type region 130 that is formed in n– well 114, a spaced-apart n+ region 132 that is formed in n– well 114, and a p+ region 134 that is formed in p– substrate 110. Further, semiconductor structure 100 has a top surface 136.

In operation, semiconductor structure 100 can represent the elements of a number of devices such as, for example, a MOS transistor (e.g., HVPMOS, isolated NMOS, LDMOS arrays) a bipolar transistor (e.g., npn, npn arrays), and a resistor (e.g., p-well, p-base). With a MOS device, p-type region 130 represents a p+ source region, n+ region 132 represents a contact region for n– well 114, and p+ region 134 represents the contact region for p– substrate 110.

Although not shown in FIG. 1, a MOS device also has a p+ drain region that is formed in n– well 114, and a channel region that is defined between source region 130 and the drain region. In addition, a layer of oxide is formed over the channel region, and a gate is formed on the layer of oxide over the channel region.

With a bipolar device, p-type region 130 represents a p– base region, n+ region 132 represents a collector contact region for n– well 114, and p+ region 134 represents the contact region for p– substrate 110. Although not shown in FIG. 1, an n+ emitter region is also formed in p– base region 130. With a resistor, p-type region 130 represents the resistor, n+ region 132 represents a contact region for n– well 114, and p+ region 134 represents the contact region for p– substrate 110.

One problem with semiconductor structure 100 is that semiconductor structure 100 is subject to a significant trench leakage current that results from deep trench isolation structure 118. When poly-filled deep trench isolation structures are utilized, the polysilicon region, such as polysilicon region 124, has a potential which is defined by the voltage on the adjacent regions and the capacitive coupling of oxide layer 122.

In some cases, the potential can be sufficient to form a parasitic channel region adjacent to the deep trench isolation structures which, in turn, provides a pathway for the trench leakage current. As shown in FIG. 1, when a channel region is present, a trench leakage current IL can flow from p-type region 130 to p– substrate 110, or from p– substrate 110 to p-type region 130, along the side walls of trench isolation structure 118, depending on the relative voltages on p– substrate 110 and p-type region 130.

The leakage current IL represents different leakage currents (or components of it) in actual devices. For example, in MOS and LDMOS devices, the leakage can appear as a sub-threshold drain-to-source leakage current Idss0. In bipolar devices, the leakage may appear as a base-to-substrate leakage current Ibs, or a collector-to-base leakage current Icbo. In arrays, the leakage can appear as a yield issue if the detected level is high.

Various steps can be taken to reduce the trench leakage current IL. For example, in a low-voltage bipolar example, the trench leakage current IL can be reduced by ensuring that p– base region 130 lies a sufficient distance X away from oxide layer 122. In a high-voltage lateral DMOS (LDMOS) example, the trench leakage current IL can be reduced by placing an n+ guard ring between oxide layer 122 and p-type region 130. In a low-voltage bipolar example, the trench leakage current IL can be reduced by the insertion of a highly-doped guard ring in between the trench and p-type region 130.

Manufactured parts which have the elements of semiconductor structure 100 can be tested to ensure that the trench leakage current IL falls within specified limits. One standard bipolar test which is often used as a measure of the trench leakage current IL is a bipolar breakdown voltage base-substrate-open (BVbso) test, which measures the current across the junction between p– substrate 110 and n+ buried layer 112.

The following Table 1 illustrates an example of a conventional bipolar BVbso test, with the rows representing the successive steps in the test.

TABLE 1

| Test Voltage on p-type region 130 | Test Voltage on n+ region 132 | Test Voltage on p+ region 134 |
| --- | --- | --- |
| Vbias | Float | 0.0 |
| Vbias –1 | Float | 0.0 |
| Vbias –2 | Float | 0.0 |
| ... | ... | ... |
| Vbias –BD | Float | 0.0 |

As shown in the first row of Table 1, p– substrate 110 is grounded via p+ region 134, n+ buried layer 112 and n– well 114 (the substrate) float via n+ region 132 which is open (not connected to a voltage source), and a positive voltage Vbias is applied to p-type region 130 (the base).

After the voltages have been applied, a current is measured at p-type region 130. Following this, the voltage applied to p-type region 130 is progressively lowered and the current measured until breakdown or punchthrough occurs (at Vbias-BD), at which time the magnitude of the current measured at p-type region 130 increases substantially.

One problem with the bipolar BVbso test, however, is that the bipolar BVbso test is a poor measure of the trench leakage current, and tends to produce incorrect results which are more optimistic than is the actual case. Thus, there is a need for a method of measuring the trench leakage current of a deep trench isolation structure that provides more accurate results.

DETAILED DESCRIPTION OF THE INVENTION

Figure 1:
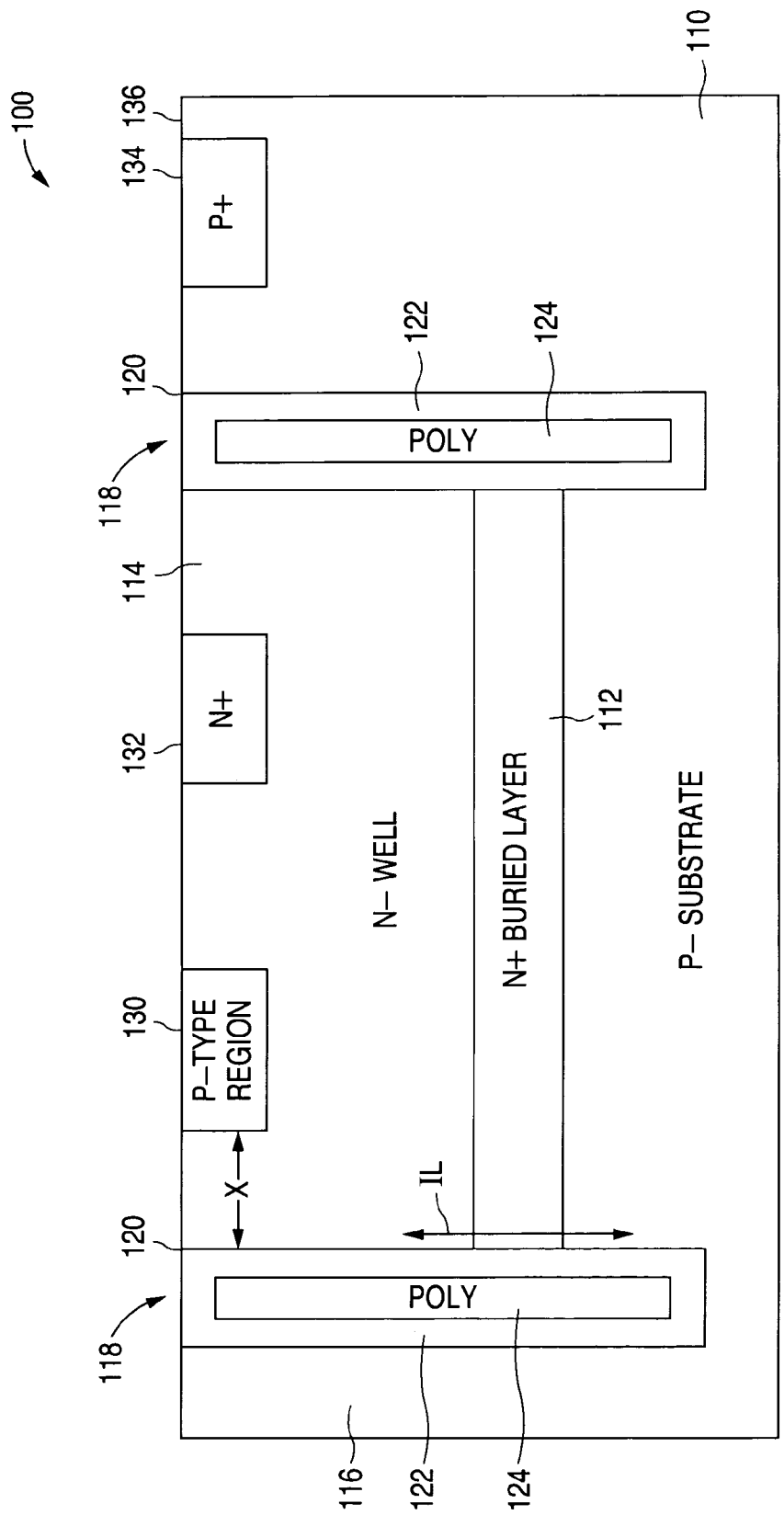
FIG. 1 is a cross-sectional diagram illustrating an example of a prior-art semiconductor structure 100 that utilizes deep trench isolation.
Figure 2:
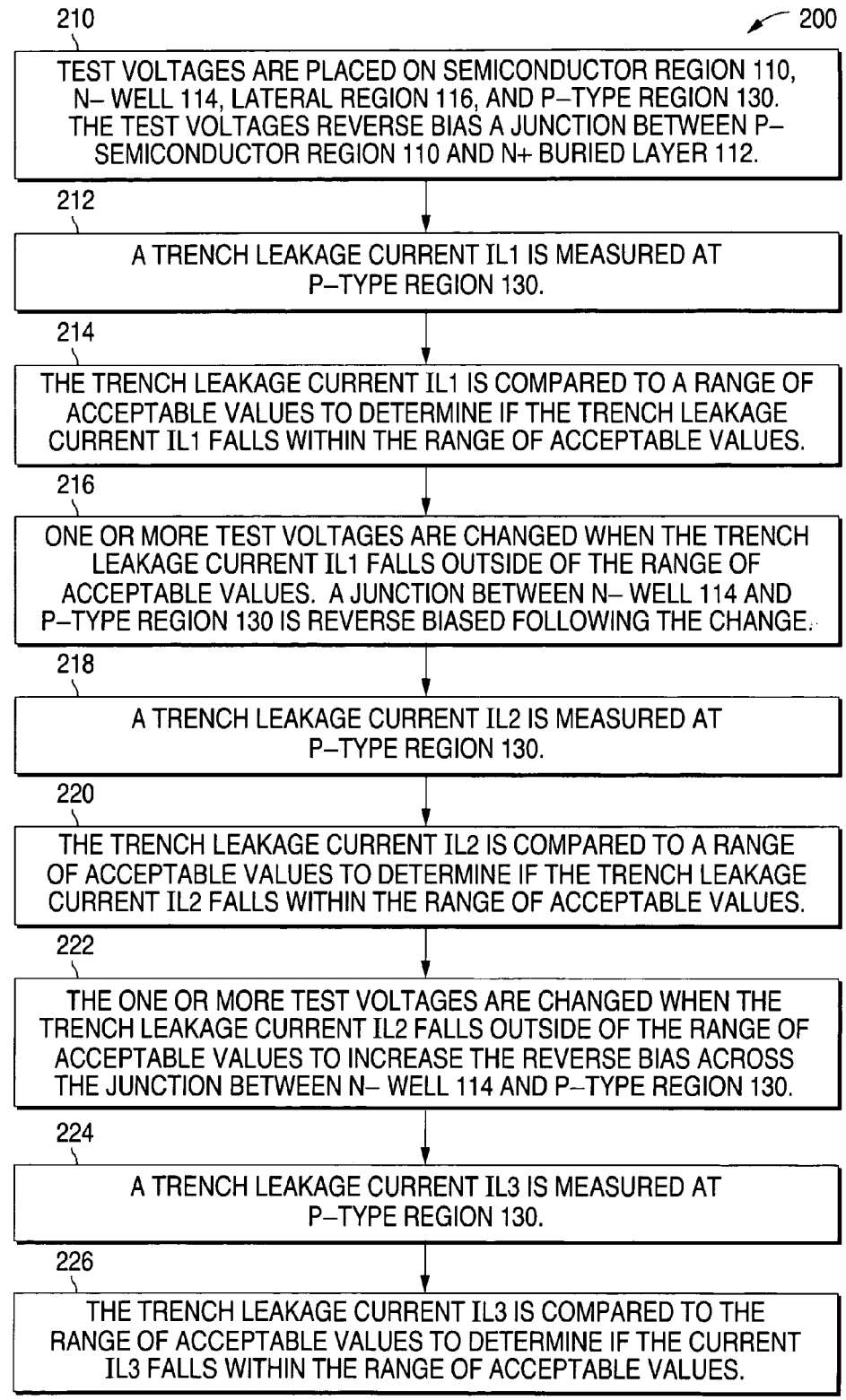
FIG. 2 is a flow chart illustrating an example of a method 200 of measuring a trench leakage current of a deep trench isolation structure in accordance with the present invention.

FIG. 2 shows a flow chart that illustrates an example of a method 200 of measuring a trench leakage current of a deep trench isolation structure in accordance with the present invention. In the present example, method 200 is applied to semiconductor structure 100 to measure the trench leakage current IL.

As shown in FIG. 2, method 200 begins at 210 where initial test voltages are placed on p– semiconductor region 110, n– well 114, lateral region 116, and p-type region 130. The test voltages utilized in 210 reverse bias a junction between p– semiconductor region 110 and n+ buried layer 112.

The following Table 2 illustrates an example of the voltages that can be utilized to implement method 200. The first row illustrates an example of the initial test voltages that can be used. As shown in the first row, ground is applied to p+ region 134 which, in turn, sets the voltage on p– substrate 110.

TABLE 2

| Test Voltage on p-type region 130 | Test voltage on n+ region 132 | Test voltage on p+ region 134 | Current at p-type region 130 |
|---|---|---|---|
| Vbias | Vbias | 0.0 | IL1 |
| Vbias −1 | Vbias | 0.0 | IL2 |
| Vbias −2 | Vbias | 0.0 | IL3 |
| ... | ... | ... | ... |
| Vbias −N | Vbias | 0.0 | ILN |

With structure 100, placing ground on p– substrate 110 also places ground on lateral region 116. On the other hand, when lateral region 116 is disconnected from p– substrate 110 such that the voltage on p– substrate 110 does not set the voltage on lateral region 116, then the voltage on lateral region 116 should be set to represent the voltage typically present on lateral region 116 during normal operation. Further, when p– semiconductor region 110 contacts a chuck, ground can also be placed on the chuck.

As further shown in the first row, the initial test voltages also include a positive voltage Vbias, which is applied to p-type region 130. In addition, the positive voltage Vbias is placed on n+ buried layer 112 and n– well 114 via n+ region 132 to reverse bias the junction between p– substrate 110 and n+ buried layer 112.

In accordance with the present invention, placing a voltage on n+ buried layer 112 and n– well 114 to reverse bias the junction between p– substrate 110 and n+ buried layer 112 provides significantly more accurate test results than can be obtained with a conventional BVbso test. This is because when a voltage is placed on n+ region 112 and n– well 114 that represents a typical well voltage that is used during normal operation, the potential on polysilicon region 124 represents a more accurate summation of all of the capacitively coupled voltages.

Next, at 212, as shown in the fourth column of Table 2, a trench leakage current IL1 is measured at p-type region 130. For example, when ground is applied to p– substrate 110 and lateral region 116, a voltage near ground is capacitively coupled to polysilicon region 124 which, in turn, attracts holes to the interface between n+ buried layer 112/n– well 114 and oxide layer 122.

When a sufficient voltage difference exists between p– substrate 110 and p-type region 130, a hole current, which represents the trench leakage current IL, can flow between p– substrate 110 and p-type region 130, along the interface between n+ buried layer 112/n– well 114 and oxide layer 122.

Following this, at 214, the trench leakage current IL1 is compared to a range of acceptable values to determine if the current IL1 falls within the range of acceptable values. When the trench leakage current IL1 falls within the range of acceptable values, structure 100 passes the test.

On the other hand, at 216, when the trench leakage current IL1 falls outside of the range of acceptable values, one or more of the test voltages are changed. A junction between n– well 114 and p-type region 130 is reverse biased following the change. The application of a reverse bias across the junction between n– well 114 and p-type region 130 enhances the detection of leakage components.

The second row of Table 2 illustrates an example of the test voltages that can be used in 216. As shown in the second row of Table 2, the test voltages can be changed by only reducing the voltage applied to p-type region 130 by a first amount to a voltage Vbias −1, with the other test voltages remaining the same. (The same result can be obtained by altering other test voltages.)

Next, at 218, as shown in the fourth column of Table 2, a trench leakage current IL2 is measured at p-type region 130. Following this, at 220, the trench leakage current IL2 is compared to the range of acceptable values to determine if the current IL2 falls within the range of acceptable values. When the trench leakage current IL2 falls within the range of acceptable values, structure 100 passes the test.

On the other hand, at 222, when the trench leakage current IL2 falls outside of the range of acceptable values, one or more of the test voltages are changed to increase the reverse bias across the junction between n– well 114 and p-type region 130. The third row of Table 2 illustrates an example of the test voltages that can be used in 222.

As shown in the third row of Table 2, the test voltages can be altered by only reducing the voltage applied to p-type region 130 by a second amount to a voltage Vbias −2, with the other test voltages remaining the same. (The same result can be obtained by altering other test voltages.)

Next, at 224, as shown in the fourth column of Table 2, a trench leakage current IL3 is measured at p-type region 130. Following this, at 226, the trench leakage current IL3 is compared to the range of acceptable values to determine if the current IL3 falls within the range of acceptable values. When the trench leakage current IL3 falls within the range of acceptable values, structure 100 passes the test.

On the other hand, when the trench leakage current IL3 falls outside of the range of acceptable values, one or more of the test voltages are changed to further increase the reverse bias across the junction between n− well 114 and p-type region 130. This process continues until structure 100 passes the test, or the bias on p− region 130 reaches zero volts. At zero volts, both p− substrate 110 and p+ region 130 have the same bias so no leakage current can flow.

As shown in Table 2, any number N of voltages can be applied to p-type region 130, depending on the required testing. In this example, the test voltages represent voltages that can be present during normal operation. In addition, the testing can continue with additional test voltages below ground placed on p-type region 130 until break down or punchthrough occurs, and provide a BVbso-type test when structure 100 represents a bipolar device.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of measuring a leakage current of a semiconductor structure, the semiconductor structure having:
   a semiconductor region of a first conductivity type;
   a well of a second conductivity type that contacts the semiconductor region;
   a device region of the first conductivity type formed in the well;
   a lateral region; and
   a deep trench isolation structure that contacts the well and the lateral region to isolate the well from the lateral region;
   the method comprising:
   placing test voltages on the semiconductor region, the well, the device region, and the lateral region, the test voltages reverse biasing a junction between the semiconductor region and the well;
   measuring a first current at the device region; and
   comparing the first current to a range of acceptable values to determine if the first current falls within the range of acceptable values.

2. The method of claim 1 and further comprising:
   changing a test voltage when the first current falls outside of the range of acceptable values, a junction between the well and the device region being reverse biased following the change;
   measuring a second current at the device region; and
   comparing the second current to the range of acceptable values to determine if the second current falls within the range of acceptable values.

3. The method of claim 2 and further comprising:
   altering the test voltage when the second current falls outside of the range of acceptable values to increase the reverse bias across the junction between the well and the device region;
   measuring a third current at the device region; and
   comparing the third current to the range of acceptable values to determine if the third current falls within the range of acceptable values.

4. A method of measuring a leakage current of a semiconductor structure, the semiconductor structure having:
   a semiconductor region of a first conductivity type;
   a well of a second conductivity type that contacts the semiconductor region;
   a device region of the first conductivity type formed in the well;
   a lateral region; and
   a deep trench isolation structure that contacts the well and the lateral region to isolate the well from the lateral region;
   the method comprising:
   placing test voltages on the semiconductor region, the well, the device region, and the lateral region by:
     placing a first test voltage on the semiconductor region;
     placing a second test voltage on the well to reverse bias the junction between the semiconductor region and the well;
     placing a third test voltage on the device region, the test voltages reverse biasing a junction between the semiconductor region and the well; and
     placing a fourth test voltage on the lateral region;
   measuring a first current at the device region;
   comparing the first current to a range of acceptable values to determine if the first current falls within the range of acceptable values;
   changing a test voltage when the first current falls outside of the range of acceptable values, a junction between the well and the device region being reverse biased following the change;
   measuring a second current at the device region; and
   comparing the second current to the range of acceptable values to determine if the second current falls within the range of acceptable values.

5. The method of claim 4 wherein changing a test voltage includes:
   changing the third test voltage by an amount to a fifth test voltage; and
   placing the fifth test voltage on the device region, a junction between the well and the device region being reverse biased after the fifth test voltage has been placed on the device region.

6. The method of claim 5 wherein the second test voltage and the third test voltage are equal.

7. The method of claim 5 wherein the first test voltage is defined by a voltage which can be present on the semiconductor region during normal operation.

8. The method of claim 7 wherein the second test voltage is defined by a voltage which can be present on the well during normal operation.

9. The method of claim 8 wherein the third and fifth test voltages are defined by voltages which can be present on the device region during normal operation.

10. The method of claim 4 wherein the first test voltage and the fourth test voltage are equal.

11. The method of claim 4 wherein the first test voltage and the fourth test voltage are not equal.

12. A method of measuring a leakage current of a semiconductor structure, the semiconductor structure having:
    a semiconductor region of a first conductivity type;
    a well of a second conductivity type that contacts the semiconductor region;
    a device region of the first conductivity type formed in the well;
    a lateral region; and
    a deep trench isolation structure that contacts the well and the lateral region to isolate the well from the lateral region;
    the method comprising:
    placing test voltages on the semiconductor region, the well, the device region, and the lateral region by:
      placing a first test voltage on the semiconductor region and the lateral region;

placing a second test voltage on the well to reverse bias the junction between the semiconductor region and the well;

placing a third test voltage on the device region, the test voltages reverse biasing a junction between the semiconductor region and the well; and measuring a first current at the device region;

comparing the first current to a range of acceptable values to determine if the first current falls within the range of acceptable values;

changing a test voltage when the first current falls outside of the range of acceptable values, a junction between the well and the device region being reverse biased following the change;

measuring a second current at the device region;

comparing the second current to the range of acceptable values to determine if the second current falls within the range of acceptable values;

altering the test voltage when the second current falls outside of the range of acceptable values to increase the reverse bias across the junction between the well and the device region;

measuring a third current at the device region; and comparing the third current to the range of acceptable values to determine if the third current falls within the range of acceptable values.

13. The method of claim 12 wherein changing a test voltage includes:

changing the third test voltage by a first amount to a fourth test voltage; and placing the fourth test voltage on the device region, a junction between the well and the device region being reverse biased after the fourth test voltage is placed on the device region.

14. The method of claim 13 wherein altering the test voltage includes:

altering the fourth test voltage by a second amount to a fifth test voltage; and placing the fifth test voltage on the device region, a junction between the well and the device region being reverse biased after the fifth test voltage is placed on the device region.

15. The method of claim 14 wherein the second test voltage and the third test voltage are equal.

16. The method of claim 15 wherein the first test voltage is defined by a voltage which can be present on the semiconductor region during normal operation.

17. The method of claim 16 wherein the second test voltage is defined by a voltage which can be present on the well during normal operation.

18. The method of claim 17 wherein the third, fourth, and fifth test voltages are defined by voltages which can be present on the device region during normal operation.

19. The method of claim 12 wherein placing the first test voltage on the semiconductor region sets a voltage on the lateral region.

20. The method of claim 12 wherein placing the first test voltage on the semiconductor region does not set a voltage on the lateral region.

* * * * *